United States Patent
Lee

(10) Patent No.: US 10,741,244 B1
(45) Date of Patent: Aug. 11, 2020

(54) MEMORY AND OPERATING METHOD THEREOF

(71) Applicant: MACRONIX INTERNATIONAL CO., LTD., Hsinchu (TW)

(72) Inventor: Ming-Hsiu Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/448,025

(22) Filed: Jun. 21, 2019

(51) Int. Cl.
*G11C 15/00* (2006.01)
*G11C 13/00* (2006.01)

(52) U.S. Cl.
CPC ........ *G11C 13/0026* (2013.01); *G11C 13/004* (2013.01); *G11C 15/00* (2013.01); *G11C 2013/0045* (2013.01)

(58) Field of Classification Search
CPC ... G11C 13/0026; G11C 13/004; G11C 15/00; G11C 2013/0045
See application file for complete search history.

(56) References Cited

U.S. PATENT DOCUMENTS

| | | | |
|---|---|---|---|
| 9,431,106 B1* | 8/2016 | Roy | G11C 15/046 |
| 2015/0206586 A1 | 7/2015 | Chang et al. | |
| 2016/0372197 A1* | 12/2016 | Roy | G11C 11/1675 |
| 2018/0137916 A1* | 5/2018 | Salama | G11C 13/0007 |

OTHER PUBLICATIONS

Bipin Rajendran et al., "Demonstration of CAM and TCAM using Phase Change Devices", 2011 3rd IEEE International Memory Workshop (IMW), IEEE; pp. 1-4.

* cited by examiner

*Primary Examiner* — Gene N Auduong
(74) *Attorney, Agent, or Firm* — McClure, Qualey & Rodack, LLP.

(57) ABSTRACT

A memory includes a memory array, multiple match lines and multiple sets of search lines. The memory array includes multiple memory cells. Each memory cell includes an output terminal, two rectifier elements and two resistor elements. The two resistor elements are configured to store two bits representing a data status. The match lines are coupled to output terminals of the memory cells respectively. Each set of search lines includes a first search line and a second search line. A first resistor element and a first rectifier element of the same memory cell are connected in series between the first search line of the same set of search lines and the output terminal. A second resistor element and a second rectifier element of the same memory cell are connected in series between the second search line of the same set of search lines and the output terminal.

11 Claims, 7 Drawing Sheets

MEMORY AND OPERATING METHOD THEREOF

BACKGROUND

Technical Field

The disclosure relates to a memory and a memory operating method, particularly to a content addressable memory and an operating method thereof.

Description of Related Art

With development of technology, more and more products are pursuing rapid and large data calculations. And in order to extend the standby time of electronic products, it is necessary to reduce power consumption while performing large data calculations.

Content addressable memory is a special type of memory, which can search all the memory units in the memory according to a data word provided by the user to generate the address of the memory unit which stores that data word. Therefore, the characteristics of the lower power consumption and the high-speed search program make the content addressable memory may meet the aforementioned requirements. And how to balance the reliability of operation and the size of the memory unit is one of the important topics in this field.

SUMMARY

One aspect of the present disclosure is a memory. The memory includes a memory array, multiple match lines and multiple sets of search lines. The memory array includes multiple memory cells. Each memory cell includes an output terminal, a first rectifier element, a second rectifier element and two resistor elements. The two resistor elements include a first resistor element and a second resistor element. The two resistor elements are configured to store two bits representing a data status. The multiple match lines are coupled to the output terminals of the memory cells respectively. The multiple sets of search lines are coupled to the memory cells respectively. Each set of search lines includes a first search line and a second search line. The first resistor element and the first rectifier element of the same memory cell are connected in series between the first search line of the same set of search lines and the output terminal of the same memory cell. The second resistor element and the second rectifier element of the same memory cell are connected in series between the second search line of the same set of search lines and the output terminal of the same memory cell.

Another aspect of the present disclosure is a memory operating method including: configuring a first resistor element and a second resistor element of each memory cell to store two bits representing a data status; multiple multiplexed circuits receiving multiple search bits of a search data respectively and outputting a bias to one of a first search line or a second search line of multiple sets of search lines respectively according to the multiple search bits; providing, by the first search line or the second search line, the bias to the first resistor element or the second resistor element of the multiple memory cells respectively, so as to generate a read current to the corresponding one of multiple match lines; detecting the read current to output a search result representing whether the data status matches one of the search bits.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the diagrams, some of the conventional structures and elements are shown with schematic illustrations.

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

In this document, the term "coupled" may also be termed "electrically coupled," and the term "connected" may be termed "electrically connected." "Coupled" and "connected" may also be used to indicate that two or more elements cooperate or interact with each other. It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

Figure 1:
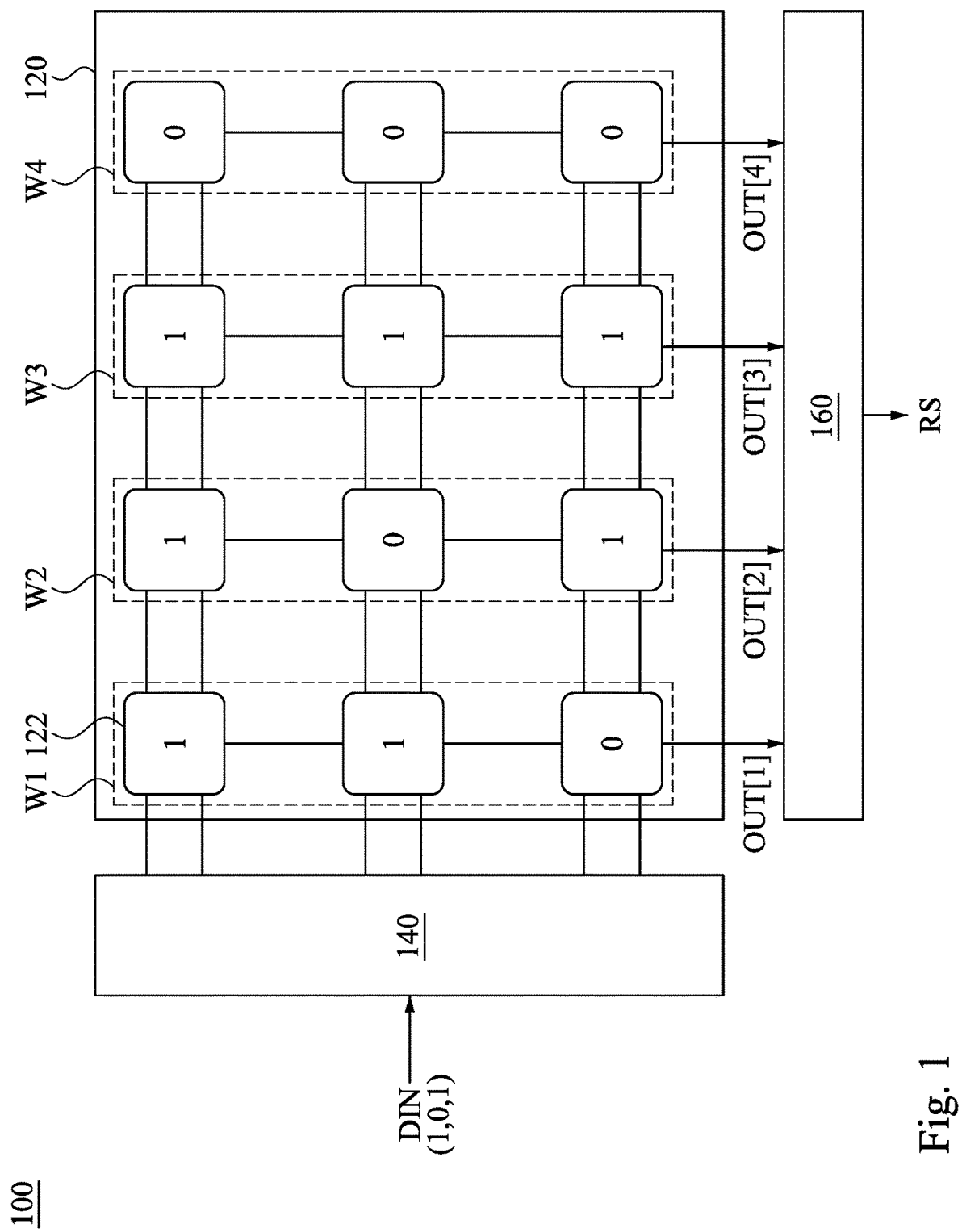
FIG. 1 is a block diagram illustrating a content addressable memory in accordance with some embodiments of the disclosure.

Please refer to FIG. 1. FIG. 1 is a block diagram illustrating a content addressable memory 100 in accordance with some embodiments of the disclosure. As shown in FIG. 1, content addressable memory 100 includes a memory array 120, a control circuit 140 and a detection circuit 160. The memory array 120 includes multiple memory cells 122 arranged in an array. Operationally, the control circuit 140 is configured to receive search data DIN, and selectively to output a bias to the corresponding memory cells in the memory array 120 according to search data DIN to perform data comparison. When the bias is applied to the memory cell in the memory array 120, the memory cell will output the corresponding output current according to the different data status stored by the memory cell itself. The detection circuit 160 receives multiple output currents outputted by the memory array 120, and outputs a search result RS according to the corresponding read currents OUT[1]-OUT[4] of the multiple output currents. In some embodiments, the detection circuit 160 includes a sense amplifier and an encoder. The sense amplifier will amplify the read currents OUT[1]~OUT[4], and the encoder will generate the search result RS based on the amplified read currents OUT[1]~OUT[4].

For example, as shown in FIG. 1, the memory cells 122 in the memory array 120 stores four stored data. The first stored data W1, the second stored data W2, the third data W3 and the fourth data W4 are 110, 101, 111 and 000, respectively. In this example, each stored data W1~W4 includes three bits respectively, and the three bits are stored by three different memory cells 122, but the present disclose are not limited to that the single stored data includes three bits, the number of bits included by each stored data may be depended on real application, such as 8 bits, 16 bits or 32 bits or other positive integer number of bits.

In the embodiments of FIG. 1, assume the search data DIN includes three bits "101", as only the first bit of the memory cell storing the first stored data W1 "110" matched, therefore, the read current OUT[1] received from the detection circuit 160 is one unit size. As the first bit, the second bit and the third bit of the memory cell storing the second stored data W2 "101" all matched, therefore, the read current OUT[2] received from the detection circuit 160 is three unit size. As the first bit and the third bit of the memory cell storing the third stored data W3 "111" matched, therefore, the read current OUT[3] received from the detection circuit 160 is two unit size. As the second bit of the memory cell storing the fourth stored data W4 "000" matched, therefore, the read current OUT[4] received from the detection circuit 160 is one unit size. In this way, by the detection circuit 160 outputs the largest one (e.g., read current OUT[2]) of the read currents OUT[1]~OUT[4] as the search result RS, the address of the memory cell (i.e., three memory cells stores the second stored data W2) which matches the search data DIN "101" is able to be found.

In some embodiments of the content addressable memory 100, the bits stored by the memory cell 122 are allowed to store a data status "X," it represents "don't care". When the bits of the memory cell 122 are set to be "X," no matter the search bit is "1" or "0," the result of the data comparison of the memory cell 122 is matched.

For example, assume a certain stored data in the memory array 120 is "10X," no matter the search data DIN is "101" or "100," the data status of the memory cell storing "10X" are matched, therefore, no matter the search data DIN is "101" or "100," the corresponding read current received by the detection circuit 160 is three unit size.

Figure 2:
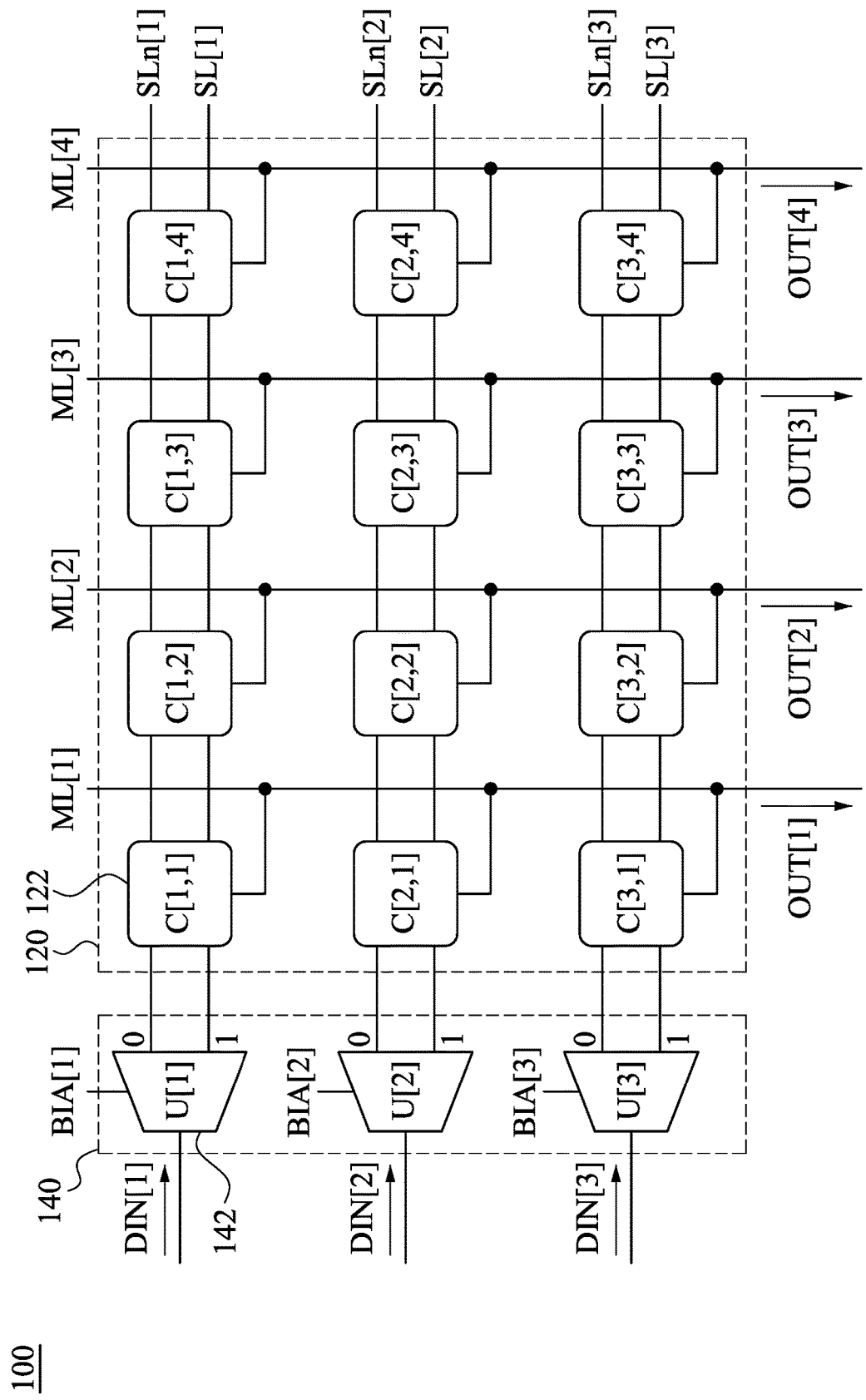
FIG. 2 is a schematic diagram illustrating a circuit of a content addressable memory in accordance with some embodiments of the disclosure.

Please refer to FIG. 2. FIG. 2 is a schematic diagram illustrating a circuit of a content addressable memory 100 in accordance with some embodiments of the disclosure. As shown in FIG. 2, the content addressable memory 100 includes a memory array 120, a control circuit 140, multiple search lines and multiple match lines. The memory array 120 includes multiple memory cells 122 arranged in an array. The control circuit 140 includes multiple multiplexed circuits 142. The number of the memory cells 122 in each column of the memory array 120 is the same as the number of the match lines, that is, related to the total number of stored data of the content addressable memory 100. The number of the memory cells 122 in each row of the memory array 120 is the same as the number of the sets of search lines, that is, related to the number of bits included by each stored data of the content addressable memory 100. For example, if the content addressable memory 100 contains 1024 stored data, the number of the memory cells 122 in each row may be 1024. If each stored data contains 8 bits, the number of the memory cells 122 in each column may be 8.

In the present embodiment, for the convenience and clarity of explanation, the content addressable memory 100 contains four stored data, and each stored data contains three bits as an example, but not limit to the present disclosure. In other words, in the present specification and the drawings, the content addressable memory 100 includes three sets of search lines SLn[1]~SLn[3] and SL[1]~SL[3], and four match lines ML[1]~ML[4], the control circuit 140 includes three multiplexed circuits U[1]~U[3], and the memory array 120 includes twelve memory cells C[1,1]~C[3,4] as the example, but not limit to the present disclosure.

As shown in FIG. 2, configurationally, the multiplexed circuit U[1] is coupled to the memory cells C[1,1]~C[1,4] through the first set of search lines SLn[1] and SL[1]. The multiplexed circuit U[2] is coupled to the memory cells C[2,1]~C[2,4] through the second set of search lines SLn[2] and SL[2]. The multiplexed circuit U[3] is coupled to the memory cells C[3,1]~C[3,4] through the third set of search lines SLn[3] and SL[3]. The match line ML[1] is coupled to the output terminals of the memory cells C[1,1]~C[3,1]. The match line ML[2] is coupled to the output terminals of the memory cells C[1,2]~C[3,2]. The match line ML[3] is coupled to the output terminals of the memory cells C[1,3]~C[3,3]. The match line ML[4] is coupled to the output terminals of the memory cells C[1,4]~C[3,4].

Operationally, the search data DIN contains three search bits DIN[1]~DIN[3] as an example. The multiplexed circuit U[1] is configured to selectively conduct the search line SLn[1] or the search line SL[1] of the first set of search lines according to the search bit DIN[1] in the search data DIN, so as to perform the data comparison between the search bit DIN[1] and the data statuses stored in the memory cells C[1,1]~C[1,4]. Similarly, the multiplexed circuit U[2] is configured to selectively conduct the search line SLn[2] or the search line SL[2] of the first set of search lines according to the search bit DIN[2] in the search data DIN, so as to perform the data comparison between the search bit DIN[2] and the data statuses stored in the memory cells C[2,1]~C[2,4]. The multiplexed circuit U[3] is configured to selectively conduct the search line SLn[3] or the search line SL[3] of the first set of search lines according to the search bit DIN[3] in the search data DIN, so as to perform the data comparison between the search bit DIN[3] and the data statuses stored in the memory cells C[3,1]~C[3,4].

In other words, the memory cells coupled to the same set of search line share the same one of the multiple multiplexed circuits. For example, the memory cells C[1,1]~C[1,4] coupled to the search line SLn[1] and SL[1] share the multiplexed circuit U[1]. The memory cells C[2,1]~C[2,4] coupled to the search line SLn[2] and SL[2] share the multiplexed circuit U[2]. The memory cells C[3,1]~C[3,4]

coupled to the search line SLn[3] and SL[3] share the multiplexed circuit U[3]. That is, the data status stored in any one of the memory cells C[1,1]~C[1,4] is compared to the search bit DIN[1], the data status stored in any one of the memory cells C[2,1]~C[2,4] is compared to the search bit DIN[2], and the data status stored in any one of the memory cells C[3,1]~C[3,4] is compared to the search bit DIN[3].

Figure 3B:
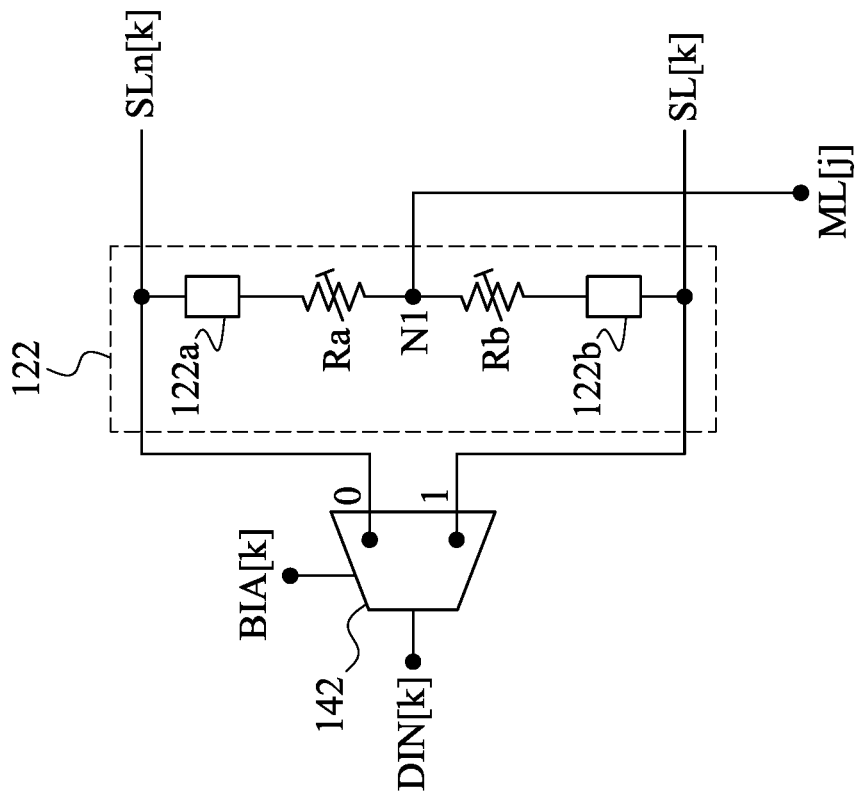
FIG. 3B is a schematic diagram illustrating another circuit of a multiplexed circuit and a memory cell in accordance with other embodiments of the disclosure.
Figure 3A:
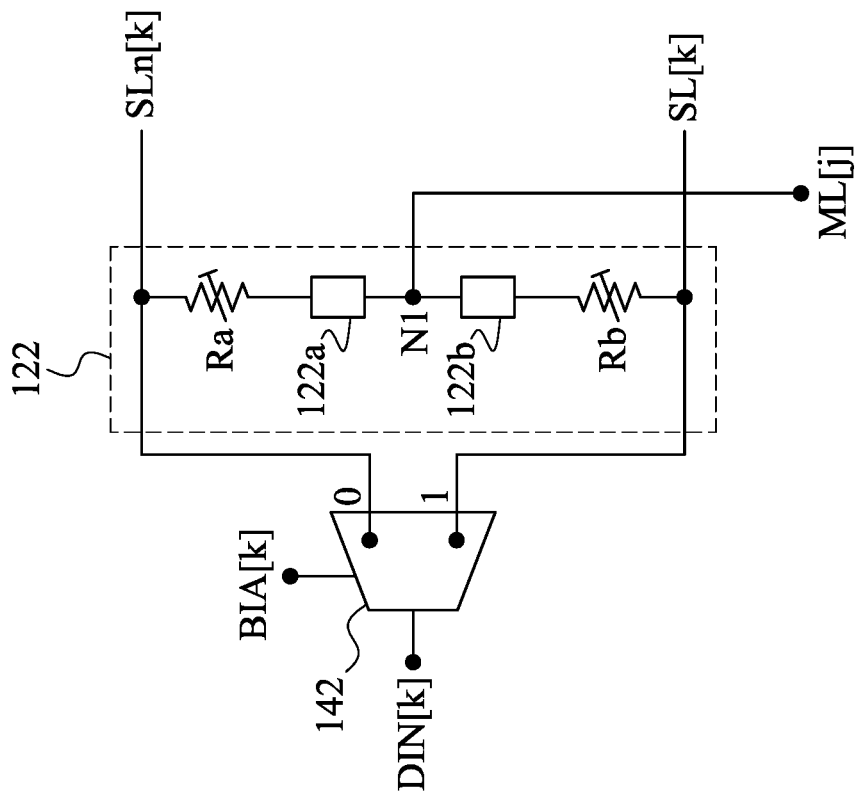
FIG. 3A is a schematic diagram illustrating a circuit of a multiplexed circuit and a memory cell in accordance with some embodiments of the disclosure.

Specifically, for detailed circuit of memory cell, please refer to FIG. 3A. FIG. 3A is a schematic diagram illustrating a circuit of a multiplexed circuit 142 and a memory cell 122 in accordance with some embodiments of the disclosure. As shown in FIG. 3A, the memory cell 122 includes two rectifier elements 122a and 122b, two resistor elements Ra and Rb, and an output terminal N1. It should be noted that, any one of the memory cells 122 in FIG. 2 may be realized by the memory cell 122 in FIG. 3A. For the convenience and clarity of explanation, the search line SLn[k], SL[k] and the match line ML[j] coupled to the memory cell 122 illustrated in FIG. 3A are not specified numeric index, it represents that the search line and the match line are coupled to unspecified memory cells 122 in the memory array 120.

As shown in FIG. 3A, configurationally, the multiplexed circuit 142 is coupled to the memory cell 122 through one set of search line SLn[k] and SL[k]. The output terminal N1 of the memory cell 122 is coupled to the match line ML[j]. Specifically, the resistor element Ra and the rectifier element 122a of the memory cell 122 coupled to the same set of search lines are connected in series between the search line SLn[k] and the output terminal N1 of the memory cell 122. The resistor element Rb and the rectifier element 122b of the memory cell 122 coupled to the same set of search lines are connected in series between the search line SL[k] and the output terminal N1 of the memory cell 122. In other words, the resistor element Ra and the rectifier element 122a of the same memory cell 122 are connected in series between the search line SLn[k] of the same set of search lines and the output terminal N1 of the same memory cell 122. The resistor element Rb and the rectifier element 122b of the same memory cell 122 are connected in series between the search line SL[k] of the same set of search lines and the output terminal N1 of the same memory cell 122.

For example, in some embodiments, as shown in FIG. 3A, the first terminal of the resistor element Ra is coupled to the search line SLn[k], the second terminal of the resistor element Ra is coupled to the first terminal of the rectifier element 122a, the second terminal of the rectifier element 122a is coupled to the output terminal N1. The first terminal of the resistor element Rb is coupled to the search line SL[k], the second terminal of the resistor element Rb is coupled to the first terminal of the rectifier element 122b, the second terminal of the rectifier element 122b is coupled to the output terminal N1.

In some other embodiments, as shown in FIG. 3B, the first terminal of the rectifier element 122a is coupled to the search line SLn[k], the second terminal of the rectifier element 122a is coupled to the first terminal of the resistor element Ra, the second terminal of the resistor element Ra is coupled to the output terminal N1. The first terminal of the rectifier element 122b is coupled to the search line SL[k], the second terminal of the rectifier element 122b is coupled to the first terminal of the resistor element Rb, the second terminal of the resistor element Rb is coupled to the output terminal N1.

It should be noted that, in some other embodiments, the circuit connection between the search line SLn[k] and the output terminal N1 may be realized as shown in FIG. 3A, and the circuit connection between the search line SL[k] and the output terminal N1 may be realized as shown in FIG. 3B. Or the circuit connection between the search line SLn[k] and the output terminal N1 may be realized as shown in FIG. 3B, and the circuit connection between the search line SL[k] and the output terminal N1 may be realized as shown in FIG. 3A.

Figure 4:
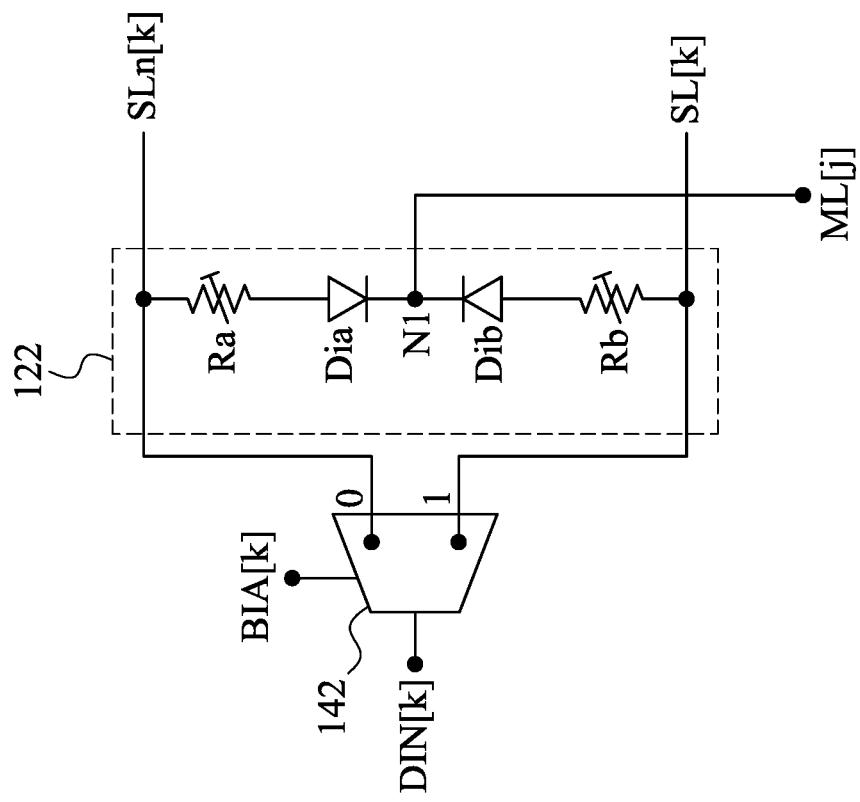
FIG. 4 is a schematic diagram illustrating another circuit of a multiplexed circuit and a memory cell in accordance with other embodiments of the disclosure.

In addition, in the present disclosure, the rectifier element 122a and 122b may be realized by the diode elements Dia and Dib shown in FIG. 4. For example, the diode elements Dia and Dib may be p-n junction diodes, schottky diodes, ovonic threshold switches, or Mott insulators, etc.

Operationally, the resistor element Ra and Rb in the memory cell 122 are configured to store a first bit and a second bit representing a data status. Specifically, the resistor value of the resistor element Ra represents the first bit. The resistor value of the resistor element Rb represents the second bit. In this disclosure, low resistor value represents logic value "1," high resistor value represents logic value "0."

In some embodiments, the memory cell 122 is able to store one of two data statuses. The two data statuses include data status "0" and data status "1." The resistor values of the resistor element Ra and Rb of the memory cell 122 representing different data status "0" or "1" are respectively shown in Table 1.

TABLE 1

| data status of the memory cell 122 | resistor element Ra | resistor element Rb |
|---|---|---|
| 0 | low(1) | high(0) |
| 1 | high(0) | low(1) |

When the data status stored in the memory cell 122 is "0," the resistor value of the resistor element Ra is configured to be low, which represents the first bit of the memory cell 122 with the logic value "1," and the resistor value of the resistor element Rb is configured to be high, which represents the second bit of the memory cell 122 with the logic value "0."

When the data status stored in the memory cell 122 is "1," the resistor value of the resistor element Ra is configured to be high, which represents the first bit of the memory cell 122 with the logic value "0," and the resistor value of the resistor element Rb is configured to be low, which represents the second bit of the memory cell 122 with the logic value "1."

In addition, in some other embodiments, the memory cell 122 is able to store one of three data statuses. The three data statuses include data status "0," data status "1" and data status "X." The resistor values of the resistor element Ra and Rb of the memory cell 122 representing different data status "0," "1" or "X" are respectively shown in Table 2.

TABLE 2

| data status of the memory cell 122 | resistor element Ra | resistor element Rb |
|---|---|---|
| 0 | low(1) | high(0) |
| 1 | high(0) | low(1) |
| X | low(1) | low(1) |

When the data status stored in the memory cell 122 is "0," the resistor value of the resistor element Ra is configured to be low, which represents the first bit of the memory cell 122 with the logic value "1," and the resistor value of the resistor element Rb is configured to be high, which represents the second bit of the memory cell 122 with the logic value "0."

When the data status stored in the memory cell 122 is "1," the resistor value of the resistor element Ra is configured to be high, which represents the first bit of the memory cell 122 with the logic value "0," and the resistor value of the resistor element Rb is configured to be low, which represents the second bit of the memory cell 122 with the logic value "1."

When the data status stored in the memory cell 122 is "X," the resistor value of the resistor element Ra is configured to be low, which represents the first bit of the memory cell 122 with the logic value "1," and the resistor value of the resistor element Rb is configured to be low, which represents the second bit of the memory cell 122 with the logic value "1."

Figure 5A:
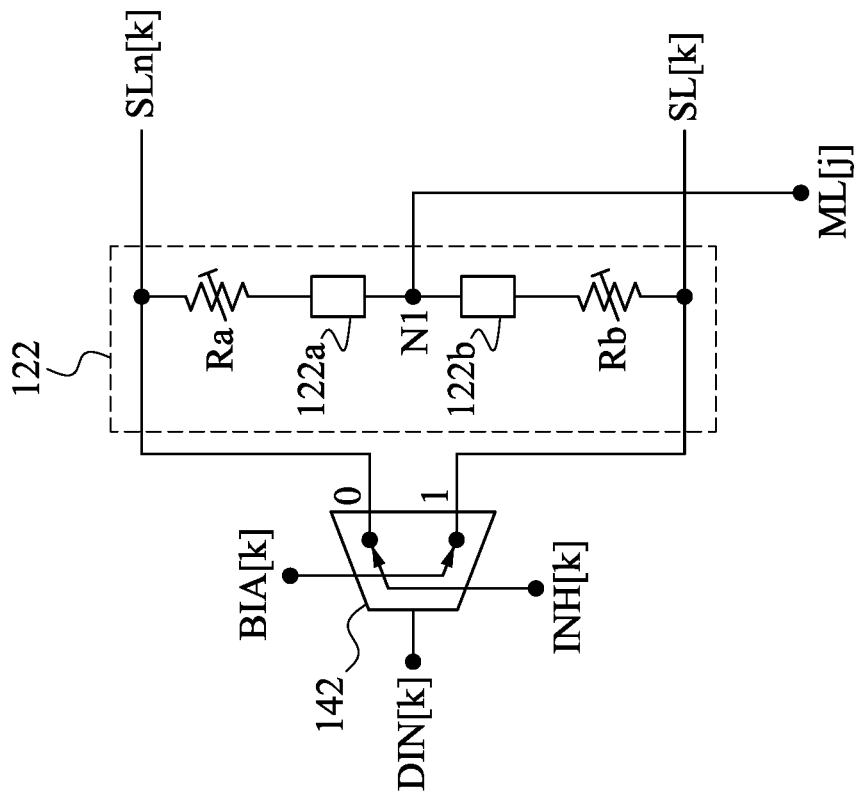
FIG. 5A is a schematic diagram illustrating operation of a multiplexed circuit and a memory cell in accordance with some embodiments of the disclosure.

Please refer to FIG. 5A. FIG. 5A is a schematic diagram illustrating operation of a multiplexed circuit 142 and a memory cell 122 in accordance with some embodiments of the disclosure. The multiplexed circuit 142 is configured to selectively conduct the first search line SLn[k] or the second search line SL[k] of one set of search lines coupled to the multiplexed circuit 142 according to the search bit DIN[k], so as to compare the data status stored in the memory cell 122 with the search bit DIN[k].

Specifically, in some embodiments, as shown in FIG. 5A, when the search bit DIN[k] is "1," the multiplexed circuit 142 applies the bias BIA[k] to the memory cell 122 through the search line SL[k] corresponding to "1" according to the search bit DIN[k] which is "1," and the search line SLn[k] corresponding to "0" is floating. When the search bit DIN[k] is "0" (not shown in Figure), the multiplexed circuit 142 applies the bias BIA[k] to the memory cell 122 through the search line SLn[k] corresponding to "0" according to the search bit DIN[k] which is "0," and the search line SL[k] corresponding to "1" is floating. In this way, the memory cell 122 received the bias BIA[k] will output the corresponding output current Io to the match line ML[j] according to the corresponding resistor element Ra or Rb.

Figure 5B:
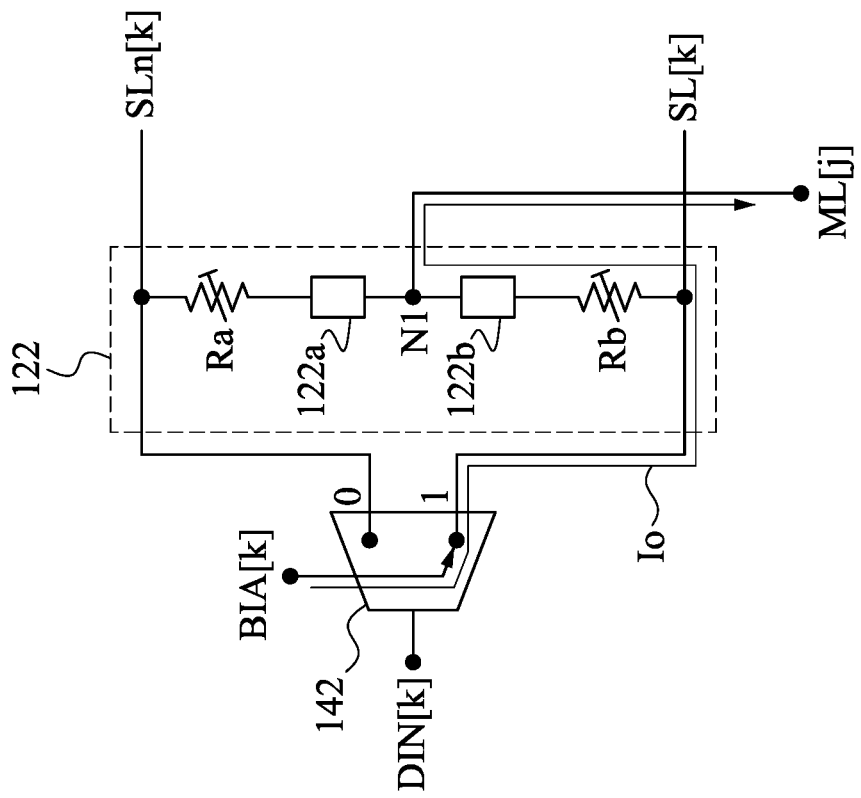
FIG. 5B is a schematic diagram illustrating another operation of a multiplexed circuit and a memory cell in accordance with other embodiments of the disclosure.

In some other embodiments, as shown in FIG. 5B, when the search bit DIN[k] is "1," the multiplexed circuit 142 is configured to apply the positive bias BIA[k] to the memory cell 122 through the search line SL[k], and to apply the non-positive bias INH[k] to the search line SLn[k] corresponding to "0." When the search bit DIN[k] is "1" (not shown in Figure), the multiplexed circuit 142 is configured to apply the positive bias BIA[k] to the memory cell 122 through the search line SLn[k], and to apply the non-positive bias INH[k] to the search line SL[k] corresponding to "1." The non-positive bias INH[k] may be negative bias or a voltage approximating to zero. In this way, by applying the non-positive bias INH[k] to the memory cell 122, the non-corresponding resistor element and the rectifier element will not output additional current to the match line ML[j], which causes the output current Io to be inaccurate.

Regarding how the memory cell outputs the corresponding current Io according to the corresponding resistance element Ra or Rb, please refer to FIG. 5A and Table 3 together.

TABLE 3

| search bit | data status | resistor element Ra | resistor element Rb | output current |
|---|---|---|---|---|
| 0 | 0 | low(1) | high(0) | high(match) |
|   | 1 | high(0) | low(1) | low(not match) |
|   | X | low(1) | low(1) | high(match) |
|   | disabled | high(0) | high(0) | low(not match) |
| 1 | 0 | low(1) | high(0) | low(not match) |
|   | 1 | high(0) | low(1) | high(match) |

TABLE 3-continued

| search bit | data status | resistor element Ra | resistor element Rb | output current |
|---|---|---|---|---|
|   | X | low(1) | low(1) | high(match) |
|   | disabled | high(0) | high(0) | low(not match) |

As shown in Table 3, in some embodiments, since memory cell 122 has two resistor elements Ra or Rb, when two resistor elements Ra or Rb are set to the high resistor value, the stored data status is disabled. When the data status of the memory cell 122 is disabled, no matter what the search bit is, the output current will be low current, which is considered to be inconsistent.

As shown in FIG. 5A, when the search bit DIN[k] is "1," the resistor element Rb of the memory cell 122 will receive the bias BIA[k], and the rectifier element 122a will make the bias BIA[k] not flow through the resistor element Ra. The resistor value passed through by the bias BIA[k] is larger, the output current Io is smaller, and the resistor value passed through by the bias BIA[k] is smaller, the output current Io is larger, therefore, when the data status of the memory cell 122 is "0," the resistor value of the resistor element Rb is high, the output current Io is low, and when the data status of the memory cell 122 is "1," the resistor value of the resistor element Rb is low, the output current Io is high. In other words, as shown in Table 3, when the search bit DIN[k] is "1," the current value of the output current Io is the opposite of the resident value of the resistor element Rb. Therefore, according to the output current Io is high current, it is able to be determined that the data status in the memory cell 122 matches the search bit. On the other hand, according to the output current Io is low current, it is able to be determined that the data status in the memory cell 122 does not match the search bit.

Similarly, as shown in FIG. 5A, when the search bit DIN[k] is "0," the resistor element Ra of the memory cell 122 will receive the bias BIA[k], and the rectifier element 122b will make the bias BIA[k] not flow through the resistor element Rb. Therefore, when the data status of the memory cell 122 is "0," the resistor value of the resistor element Ra is low, the output current Io is high, and when the data status of the memory cell 122 is "1," the resistor value of the resistor element Ra is high, the output current Io is low. In other words, as shown in Table 3, when the search bit DIN[k] is "0," the current value of the output current Io is the opposite of the resident value of the resistor element Ra. Therefore, according to the output current Io is high current, it is able to be determined that the data status in the memory cell 122 matches the search bit. On the other hand, according to the output current Io is low current, it is able to be determined that the data status in the memory cell 122 does not match the search bit.

In this way, when the data status stored by the memory cell itself matches the corresponding search bit, the memory cell will output high current. On the contrary, when the data status stored by the memory cell itself does not match the corresponding search bit, the memory cell will output low current.

In this way, the first bit and the second bit representing different data statuses are respectively stored by the resistor element Ra and Rb in the memory cell 122, and by the multiplexed circuit 142, the bias BIA[k] is applied to the resistor element Rb of the memory cell 122 through the search line SL[k] according to the search bit being "1," or the bias BIA[k] is applied to the resistor element Ra of the memory cell 122 through the search line SLn[k] according to the search bit being "0", so that it is able to be known whether the data status of the memory cell 122 matches the search bit according to the corresponding output current Io. Furthermore, with the rectifier elements 122a and 122b, it is ensured that no leakage current flows from the resist element on the non-applied side.

Please refer back to FIG. 2. As shown in FIG. 2, when the search bit DIN[1] is "1," the multiplexed circuit U[1] conduct the search line SL[1] to apply the bias BIA[1] to the memory cells C[1,1]~C[1,4] through the search line SL[1], so as to compare whether the second bit of each memory cell C[1,1]~C[1,4] matches the search bit DIN[1] or not. On the contrary, when the search bit DIN[1] is "0," the multiplexed circuit U[1] conduct the search line SLn[1] to apply the bias BIA[1] to the memory cells C[1,1]~C[1,4] through the search line SLn[1], so as to compare whether the first bit of each memory cell C[1,1]~C[1,4] matches the search bit DIN[1] or not.

For example, assume the search bits DIN[1]~DIN[3] are 1, 0 and 1, respectively, and the data statuses stored by the memory cells C[1,1]~C[3,1] are 1, 1 and 0, respectively. According to Table 5, the output currents of the memory cells C[1,1]~C[3,1] are high, low and low, respectively, therefore, the read current OUT[1] of the total current received from the memory cells C[1,1]~C[3,1] by the match line ML[1] is one unit size.

And so on, assume the data statuses stored by the memory cells C[1,2]~C[3,2], C[1,3]~C[3,3] and C[1,4]~C[3,4] are 1, 0, 1 and 1, 1, 1 and 0, 0, 0, respectively, then the output currents of the memory cells C[1,2]~C[3,2], C[1,3]~C[3,3] and C[1,4]~C[3,4] are high, high, high and high, low, high and low high, low, respectively. Therefore, the read currents OUT[2]~OUT[4] received by the match lines ML[2]~ML[4] are three, two and one unit size, respectively.

In this way, the detection circuit 160 outputs the largest one (i.e., the read current OUT[2] with three unit size) of the read currents OUT[1]~OUT[4] received from the match lines ML[1]~ML[4] as the search result RS, so that it is able to find the memory cells C[1,2]~C[3,2] which matches the search data DIN "101."

Figure 6:
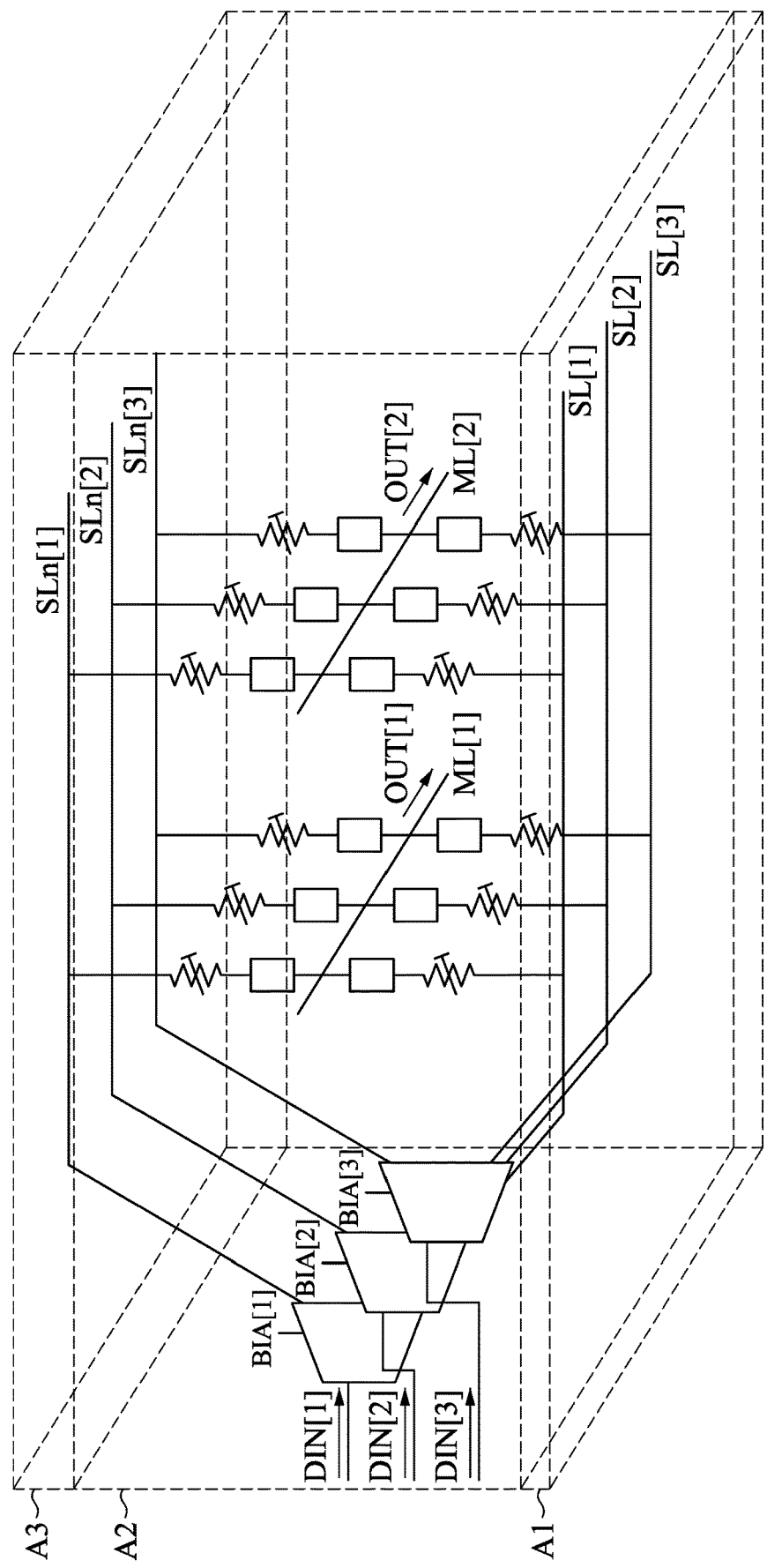
FIG. 6 is a schematic diagram illustrating a structure of a content addressable memory in accordance with some embodiments of the disclosure.

Please refer to FIG. 6. FIG. 6 is a schematic diagram illustrating a structure of a content addressable memory 100a in accordance with some embodiments of the disclosure. In some embodiments, the content addressable memory 100 in FIG. 2 may be realized by the content addressable memory 100a in FIG. 6. In the embodiment of FIG. 6, elements similar to those in the embodiment of FIG. 2 are denoted by the same reference symbols. As shown in FIG. 6, the search lines SL[1]~SL[3] included by a first region A1 may be arranged on a subtract or a first conductive layer. The transmission lines of transferring the search bits DIN[1]~DIN[3], the multiplexed circuit, the match lines ML[1] and ML[2] included by a second region A2 may be arranged on a second conductive layer. The search lines SLn[1]~SLn[3] included by a second region A3 may be arranged on a third conductive layer. In some embodiments, the conductive layers may be made of polycrystalline germanium material, metal material or other conductive material. And the search lines, match lines, transmission lines or other connection lines may be implemented by laying a patterned metal wire in the conductor layer.

Figure 7:
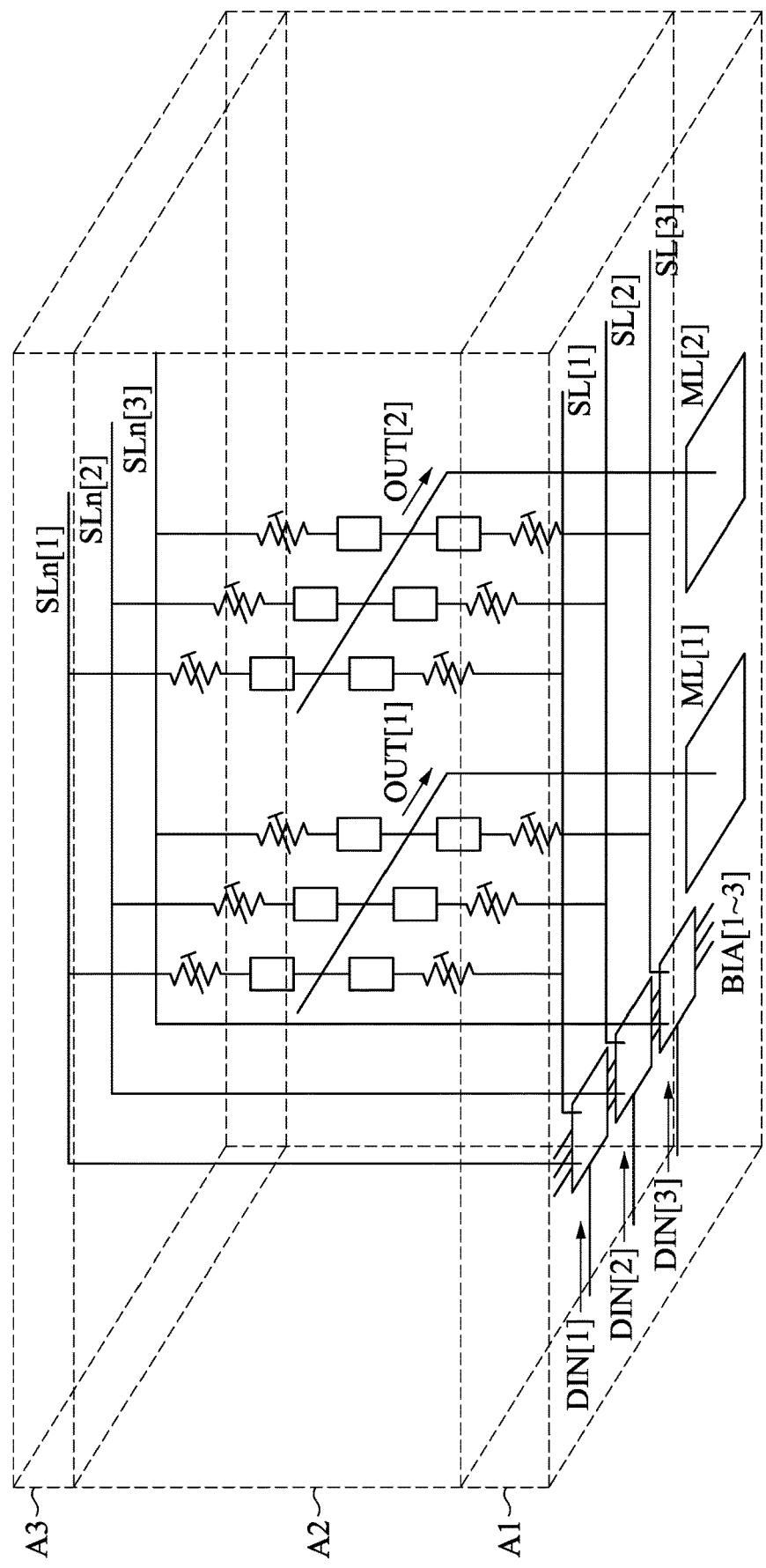
FIG. 7 is a schematic diagram illustrating another structure of a content addressable memory in accordance with other embodiments of the disclosure.

Please refer to FIG. 7. FIG. 7 is a schematic diagram illustrating another structure of a content addressable memory 100b in accordance with other embodiments of the disclosure. In the embodiment of FIG. 7, elements similar to those in the embodiment of FIG. 2 are denoted by the same reference symbols. As shown in FIG. 7, the transmission lines of transferring the search bits DIN[1]~DIN[3], the multiplexed circuit and the search lines SL[1]~SL[3] included by a first region A1 may be arranged on a subtract or a first conductive layer. The match lines ML[1] and ML[2] included by a second region A2 may be arranged on a second conductive layer. The search lines SLn[1]~SLn[3] included by a second region A3 may be arranged on a third conductive layer.

It should be noted that, the circuit structure and/or circuit operation of the content addressable memory 100 shows in FIG. 1~7 above may be used to other types of memory in some other embodiments, not intended to limit to the present disclosure.

In the foregoing, exemplary operations are included. However, these operations do not need to be performed sequentially. The operations mentioned in the embodiment may be adjusted according to actual needs unless the order is specifically stated, and may even be performed simultaneously or partially simultaneously.

It is noted that, the drawings, the embodiments, and the features and circuits in the various embodiments may be combined with each other as long as no contradiction appears. The circuits illustrated in the drawings are merely examples and simplified for the simplicity and the ease of understanding, but not meant to limit the present disclosure. In addition, those skilled in the art can understand that in various embodiments, circuit units may be implemented by different types of analog or digital circuits or by different chips having integrated circuits. Components may also be integrated in a single chip having integrated circuits. The description above is merely by examples and not meant to limit the present disclosure.

In summary, in various embodiments of the present disclosure, the first bit and the second bit representing different data statuses are respectively stored by the resistor element Ra and Rb in the memory cell 122, and by the multiplexed circuit 142, the bias BIA[k] is applied to the resistor element Ra or Rb of the memory cell 122 according to the search bit being "1" or "0," so that it is able to be known whether the data status of the memory cell 122 matches the search bit according to the corresponding output current Io. Furthermore, with the rectifier elements 122a and 122b, it is ensured that no leakage current flows from the resist element on the non-applied side.

Although specific embodiments of the disclosure have been disclosed with reference to the above embodiments, these embodiments are not intended to limit the disclosure. Various alterations and modifications may be performed on the disclosure by those of ordinary skills in the art without departing from the principle and spirit of the disclosure. Thus, the protective scope of the disclosure shall be defined by the appended claims.

What is claimed is:

1. A memory, comprising:
   a memory array, comprising a plurality of memory cells, each of the plurality of memory cells comprising:
      an output terminal;
      a first rectifier element and a second rectifier element; and
      a first resistor element and a second resistor element, the two resistor elements configured to store two bits representing a data status;
   a plurality of match lines, the plurality of match lines coupled to the output terminals of the memory cells respectively; and
   a plurality of sets of search lines, the plurality of sets of search lines coupled to the memory cells respectively, each set of search lines comprising a first search line and a second search line, the first resistor element and the first rectifier element of the same memory cell connected in series between the first search line of the same set of search lines and the output terminal of the same memory cell, the second resistor element and the second rectifier element of the same memory cell connected in series between the second search line of the same set of search lines and the output terminal of the same memory cell.

2. The memory of claim 1, wherein the two bits comprises a first bit and a second bit, the data status is one of a first data status and a second data status,
the first bit with a first logic value and the second bit with a second logic value represents the first data status,
the first bit with the second logic value and the second bit with the first logic value represents the second data status.

3. The memory of claim 1, wherein the two bits comprises a first bit and a second bit, the data status is one of a first data status, a second data status and a third data status,
the first bit with a first logic value and the second bit with a second logic value represents the first data status,
the first bit with the second logic value and the second bit with the first logic value represents the second data status,
the first bit with the first logic value and the second bit with the first logic value represents the third data status.

4. The memory of claim 1, further comprising:
a plurality of multiplexed circuits, the plurality of multiplexed circuits coupled to the plurality of set of search lines respectively, the plurality of multiplexed circuits configured to selectively conduct the corresponding first search line or the corresponding second search line of the plurality of set of search lines according to a search data.

5. The memory of claim 4, wherein the memory cells coupled to the same set of search lines share the same one of the plurality of multiplexed circuits.

6. The memory of claim 4, wherein the search data comprises a plurality of search bits, each of the plurality of search bits is one of a first logic value or a second logic value,
when one of the plurality of search bits is the first logic value, the corresponding one of the plurality of multiplexed circuits conducts the first search line,
when one of the plurality of search bits is the second logic value, the corresponding one of the plurality of multiplexed circuits conducts the second search line.

7. The memory of claim 4, wherein the search data comprises a plurality of search bits, each of the plurality of search bits is one of a first logic value or a second logic value,
when one of the plurality of search bits is the first logic value, the corresponding one of the plurality of multiplexed circuits outputs a positive bias to the first search line and outputs a non-positive bias to the second search line,
when one of the plurality of search bits is the second logic value, the corresponding one of the plurality of multiplexed circuits a positive bias to the second search line and outputs a non-positive bias to the first search line.

8. The memory of claim 1, further comprising:
a detection circuit, configured to receive a plurality of read currents outputted by the plurality of match lines, and to output a search result according to the plurality of read currents.

9. The memory of claim 1, wherein a first terminal of the first resistor element is coupled to the first search line, a second terminal of the first resistor element is coupled to a first terminal of the first rectifier element, a second terminal of the first rectifier element is coupled to the output terminal, a first terminal of the second resistor element is coupled to the second search line, a second terminal of the second resistor element is coupled to a first terminal of the second rectifier element, a second terminal of the second rectifier element is coupled to the output terminal.

10. The memory of claim 1, wherein a first terminal of the first rectifier element is coupled to the first search line, a second terminal of the first rectifier element is coupled to a first terminal of the first resistor element, a second terminal of the first resistor element is coupled to the output terminal, a first terminal of the second rectifier element is coupled to the second search line, a second terminal of the second rectifier element is coupled to a first terminal of the second resistor element, a second terminal of the second resistor element is coupled to the output terminal.

11. A memory operating method, comprising:
configuring resistor values of a first resistor element and a second resistor element of each of a plurality of memory cells to store two bits representing a data status;
a plurality of multiplexed circuits receiving a plurality of search bits of a search data respectively and outputting a bias to one of a first search line or a second search line of a plurality of sets of search lines respectively according to the plurality of search bits;
providing, by the first search line or the second search line, the bias to the first resistor element or the second resistor element of the plurality of memory cells respectively, so as to generate a read current to the corresponding one of a plurality of match lines; and
detecting the read current to output a search result representing whether the data status matches one of the search bits.

* * * * *